DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED MARCH 2, 1976

944 O.G. 41

T944,004

DEVICE TO IMPROVE THE REVERSE LEAKAGE CHARACTERISTICS IN METAL SEMICONDUCTOR CONTACTS

Carl Altman, Lagrangeville, Sydney G. Chapman, Poughkeepsie, and Akella V. S. Satya, Wappingers Falls, N.Y., assignors to International Business Machines Corporation, Armonk, N.Y.

Continuation of abandoned application Ser. No. 244,157, Apr. 14, 1972. This application Oct. 21, 1974, Ser. No. 516,548.

Int. Cl. H01l *29/48, 29/56*

U.S. Cl. 357—15

2 Sheets Drawing. 14 Pages Specification

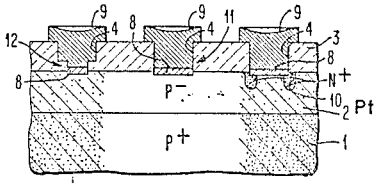

Figure 1A:
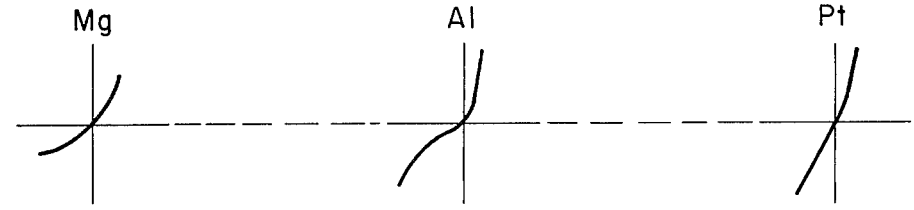
Figure 1B:
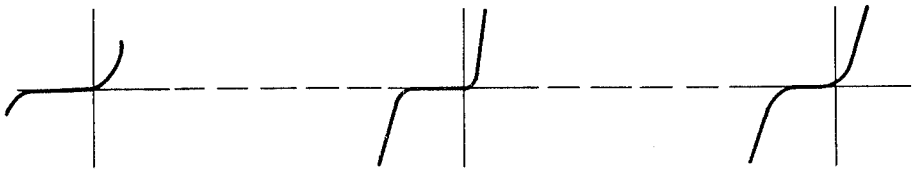
Figure 2:
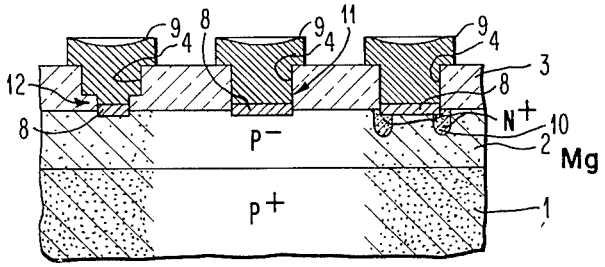
Figure 3:
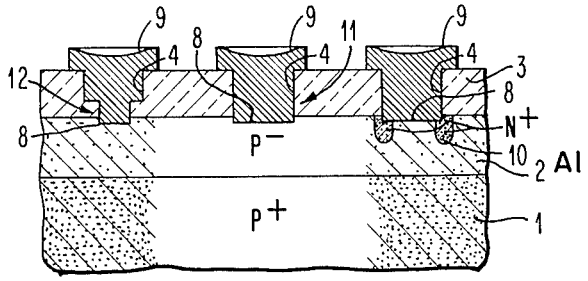
Figure 4:
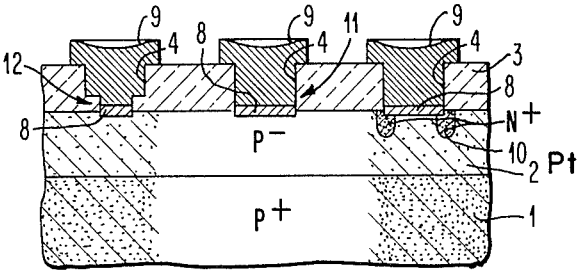
Figure 5:
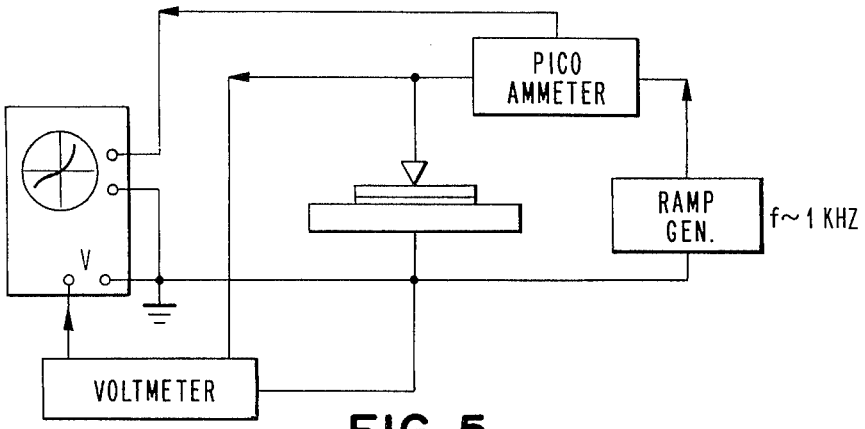
Figure 6:
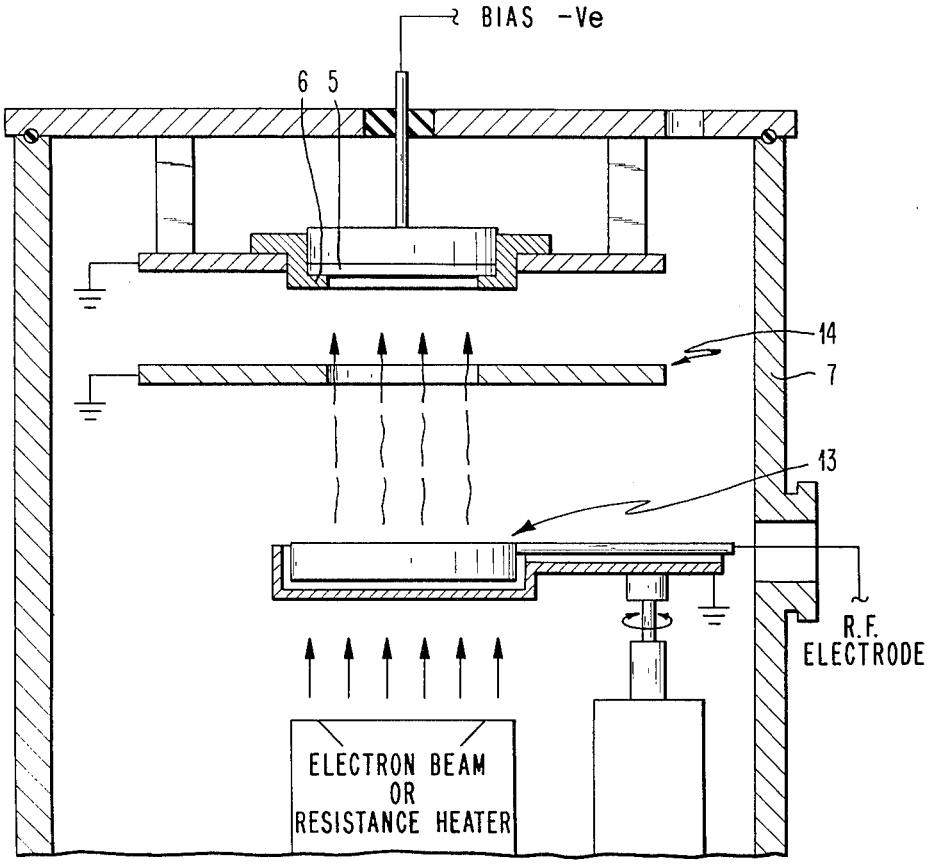

FIG. 1A is illustrative current voltage curves comparing diodes produced in accordance with the prior art methods showing the conventional "soft knee" reverse bias characteristics of metal semiconductor diodes on P type substrates. FIG. 1B has the same characteristics of metal P type semiconductor diodes produced in accordance with this invention. Referring to the non-guard ring structure shown centrally in FIGS. 2, 3, and 4, typically a P-type substrate 1 is provided with an epitaxial layer 2 of two to three microns thick, upon which an oxide or insulating layer 3 is grown in the magnitude of 3000 A thickness. The oxide layer is selectively etched utilizing photoresist and etchant to open an area through to the semiconductor material. This is known in the art as a diffusion or metallization window. These openings are illustrated at 4 in the above-mentioned figures. These etched or otherwise provided contact areas are subjected to low energy ionic bombardment utilizing illustrative apparatus shown in FIG. 6 wherein a wafer or substrate 5 is supported at 6 in an evacuated chamber 7 wherein a plasma state of an inert atmosphere such as argon is supported between an RF electrode 13 and an annular ground plate 14. The wafer is subjected to ion bombardment from the said plasma by means of a negative DC bias on the wafer 5. The bombardment treatment is followed by metal deposition utilizing an electron beam gun or any other suitable mechanism. The metal is deposited into the hole 4 to produce a metal semiconductor contact at 8. FIGS. 2, 3, and 4 illustrate the metal semiconductor contact devices using magnesium, aluminum and platinum as the contact metals. Interconnection metallurgy, for example, aluminum if different from the said contact metal is deposited at 9 to complete the device formation. FIG. 5 is a schematic illustration of a test procedure apparatus used to determine the current voltage characteristics illustrated in FIGS. 1A and 1B.

DEVICE TO IMPROVE THE REVERSE LEAKAGE CHARACTERISTICS IN METAL SEMICONDUCTOR CONTACTS

Original Filed Oct. 21, 1974